(12) United States Patent
Natori

(10) Patent No.: US 7,018,676 B2
(45) Date of Patent: Mar. 28, 2006

(54) METHOD AND DEVICE FOR MANUFACTURING CERAMICS, SEMICONDUCTOR DEVICE AND PIEZOELECTRIC DEVICE

(75) Inventor: Eiji Natori, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/819,688

(22) Filed: Mar. 29, 2001

(65) Prior Publication Data

US 2002/0055201 A1 May 9, 2002

(30) Foreign Application Priority Data

Mar. 29, 2000 (JP) .............................. 2000-091604

(51) Int. Cl.
*C23C 16/00* (2006.01)
*H01L 21/00* (2006.01)
*H01L 21/44* (2006.01)

(52) U.S. Cl. ...................... 427/255.25; 427/252; 438/3; 438/680

(58) Field of Classification Search .................. 365/65, 365/109, 145, 174; 438/680, 681, 683, 685, 438/3; 427/252, 255.25
See application file for complete search history.

(56) References Cited

U.S. PATENT DOCUMENTS

| | | | |
|---|---|---|---|
| 4,500,397 A * | 2/1985 | Mori ........................... | 204/487 |
| 5,066,512 A | 11/1991 | Goldowsky et al. | |
| 5,456,945 A * | 10/1995 | McMillan et al. .......... | 118/715 |
| 5,540,959 A | 7/1996 | Wang | |
| 5,563,762 A * | 10/1996 | Leung et al. ................ | 257/295 |
| 5,624,720 A | 4/1997 | Osada et al. | |
| 5,932,904 A * | 8/1999 | Hsu et al. .................... | 257/295 |
| 6,060,391 A * | 5/2000 | Tatsumi ....................... | 438/680 |
| 6,110,531 A * | 8/2000 | Paz de Araujo et al. ...................... | 427/255.25 |
| 6,120,846 A * | 9/2000 | Hintermaier et al. ........ | 427/269 |
| 6,146,905 A * | 11/2000 | Chivukula et al. ............. | 438/3 |
| 6,207,236 B1 * | 3/2001 | Araki et al. ................. | 427/386 |
| 6,232,167 B1 * | 5/2001 | Satoh et al. ................. | 365/109 |
| 6,349,668 B1 * | 2/2002 | Sun et al. ............... | 118/723 R |

FOREIGN PATENT DOCUMENTS

EP 0 828 012 A1 3/1998
FR 2 729 400 A1 7/1996

(Continued)

OTHER PUBLICATIONS

Jpn. J. Appl. Phys. vol. 33 (1994) pp. 5135-5138 Part 1, No. 9B, Sep. 1994; Effects of $O_3$ on Growth and Electric Properties of $Pb(Zr, Ti)O_3$ Thin Films by Photoenhanced Metalorganic Chemical Vapor Deposition.

(Continued)

*Primary Examiner*—Carl Whitehead, Jr.
*Assistant Examiner*—Heather Doty
(74) *Attorney, Agent, or Firm*—Oliff & Berridge, PLC

(57) ABSTRACT

A method for manufacturing ceramics includes a step of forming a ceramic film on a substrate by mixing a fine particle of a raw material species which becomes at least part of raw materials for ceramics with an active species, and feeding the mixed fine particle and active species to the substrate. A manufacture device includes a disposing section which also serves as a heating section for a substrate, a raw material species feeding section for feeding a fine particle of a raw material species, an active species feeding section for feeding an active species, and a mixing section for mixing the raw material species and the active species.

16 Claims, 3 Drawing Sheets

FOREIGN PATENT DOCUMENTS

| | | | |
|---|---|---|---|
| JP | 02-200782 | | 8/1960 |
| JP | 402179880 | * | 6/1990 |
| JP | 402179880 | * | 7/1990 |
| JP | A 3-53068 | | 3/1991 |
| JP | A 3-182720 | | 8/1991 |
| JP | 04035033 | * | 2/1992 |
| JP | 05-078103 | | 3/1993 |
| JP | A 7-138761 | | 5/1995 |
| JP | 09-064307 | | 3/1997 |
| JP | 09-153597 | | 6/1997 |
| JP | A 10-88354 | | 4/1998 |
| KR | 10-0202532 B1 | | 3/1999 |
| WO | WO 92/15112 | | 9/1992 |
| WO | WO 93/16811 | | 9/1993 |
| WO | WO 97/33013 | | 9/1997 |
| WO | WO 99/02756 | | 1/1999 |

OTHER PUBLICATIONS

U.S. Appl. No. 09/819,687, filed Mar. 29, 2001, Natori.

* cited by examiner

METHOD AND DEVICE FOR MANUFACTURING CERAMICS, SEMICONDUCTOR DEVICE AND PIEZOELECTRIC DEVICE

The present application includes the entire content of Japanese Patent Application No. 2000-91604 filed on Mar. 29, 2000.

1. Field of the Invention

The present invention relates to a method and a device for manufacturing ceramics such as an oxide film, nitride film, and ferroelectric film, and a semiconductor device and a piezoelectric device using the ferroelectric film.

2. Description of the Related Art

As a process for depositing ferroelectrics, a solution deposition process, sputtering process, laser ablation process, MOCVD (Metal-Organic Chemical Vapor Deposition) process, LSMCD (Liquid Source Misted Chemical Deposition) process, and the like are known. In the field of semiconductor devices for which highly integration is needed, an MOCVD process and an LSMCD process have attracted attention. In particular, the LSMCD process has attracted attention as a process for forming a ferroelectric film which makes up a capacitor of ferroelectric memory devices. This is because the LSMCD process allows easy control of the composition of the film, reduces unevenness between wafers and lots, and is stable in comparison with the MOCVD process.

However, in the case of forming a semiconductor device including a ferroelectric capacitor by the LSMCD process, since a mist (fine particles) of the raw material species generally has a particle diameter of 0.1 μm to 0.3 μm, this process cannot be applied to a design rule of 0.5 μm or less for semiconductor devices. In the case of decreasing the particle diameter of the mist of the raw material species so as to be applied to a design rule for semiconductor devices, the deposition rate significantly decreases, whereby bottom or side coverage becomes poor.

In the case of forming ferroelectric materials such as PZT (Pb(Zr, Ti)$O_3$) and SBT (SrBi$_2$Ta$_2$O$_9$), a high process temperature is needed. For example, deposition of PZT generally requires a temperature of 600° C. to 700° C., and deposition of SBT requires a temperature of 650° C. to 800° C. Characteristics of the ferroelectrics depend on their crystallinity. In general, ferroelectrics having higher crystallinity have superior characteristics.

In semiconductor devices equipped with a capacitor including a ferroelectric film (ferroelectric capacitor) such as ferroelectric memory devices, characteristics such as residual polarization characteristics, coercive field characteristics, fatigue characteristics, and imprint characteristics are significantly affected by the crystallinity of the ferroelectrics. Since the ferroelectrics are polyatomic and have a complicated perovskite crystal structure, atoms must be provided with a large amount of migration energy at the time of crystallization in order to obtain ferroelectrics having good crystallinity. Therefore, a high process temperature is required for crystallization of the ferroelectrics.

However, if the process temperature for the ferroelectric film is increased, ferroelectric memory devices tend to be damaged. Specifically, crystallization of the ferroelectrics requires a high-temperature heat treatment in an oxygen atmosphere. Insulating layers formed during this high-temperature heat treatment due to oxidization of polysilicon or electrode materials cause the characteristics of the ferroelectric capacitor to deteriorate. Pb and Bi which are constituent elements for PZT and SBT tend to be easily diffused. These elements are diffused into the semiconductor devices, thereby causing the semiconductor devices to deteriorate. Such deteriorations become significant as the process temperature for the ferroelectric film increases and the semiconductor devices are integrated to a higher degree (semiconductor devices with an integration degree of 1 Mbit or more, for example).

Therefore, ferroelectric capacitors have been applied to semiconductor devices integrated to such a degree that the devices are less affected even if the process temperature for the ferroelectric film is increased (1 Kbit to 256 Kbit, for example). However, an integration degree from 16 Mbit to Gbit has already been required for a DRAM, flash memory, and the like, whereby application fields for the ferroelectric memory devices are limited. In the case of preventing the deterioration of the devices due to a high-temperature oxygen atmosphere by decreasing the process temperature for the ferroelectrics, crystallinity of the ferroelectric film decreases. As a result, the residual polarization characteristics of the ferroelectric capacitors decreases, whereby fatigue characteristics, imprint characteristics, retention characteristics, and the like also decrease.

SUMMARY OF THE INVENTION

An objective of the present invention is to provide a method for manufacturing ceramics excelling in characteristics such as crystallinity while decreasing the process temperature, and a device for manufacturing the ceramics.

Another objective of the present invention is to provide a semiconductor device and a piezoelectric device using the ceramics obtained by the method of the present invention.

(A) Manufacture Method

A manufacture method according to the present invention comprises a step of forming a ceramic film on a substrate by mixing a fine particle of a raw material species which becomes at least part of raw materials for ceramics with an active species, and feeding the mixed fine particle and active species to the substrate.

According to this manufacture method, the fine particles of the raw material species can be deposited on the substrate while being provided with the kinetic energy by mixing the active species having high kinetic energy and the fine particles of the raw material species before allowing the active species and the fine particles to come in contact with the substrate. Therefore, the deposition rate can be controlled even if the fine particles of the raw material species have a small particle diameter of suitably 0.1 μm or less, and still more suitably 0.01 μm or less, whereby a ceramic film exhibiting good bottom or side coverage can be formed.

Moreover, migration energy of atoms in the film can be increased by providing energy to the fine particles by the active species. As a result, ceramics having excellent film characteristics such as crystallinity can be formed at a lower process temperature in comparison with the case of feeding no active species.

Since the film obtained by the manufacture method of the present invention has uniformly distributed minute vacancies, the atoms easily migrate. Therefore, the amount of energy required for crystallization can be decreased, thereby further decreasing the process temperature.

As described above, in the case of forming ferroelectrics by applying the manufacture method of the present invention, ferroelectrics having high crystallinity can be obtained at a process temperature of 500° C. or less. For example, in the case of SBT, crystallization can be performed at a temperature of suitably 600° C. or less, and still more suitably 450° C. or less. In the case of PZT, crystallization can be performed at a temperature of suitably 500° C. or less, and still more suitably 450° C. or less. In the case of BST ((Ba, Sr)TiO$_3$), crystallization can be performed at a temperature of suitably 500° C. or less, and still more suitably 450° C. or less.

Further embodiments of the manufacture method according to the present invention are given below.

(1) A diameter (the diameter corresponding to the peak in the diameter distribution, for example) of the fine particle may be suitably 0.1 μm or less, and still more suitably 0.01 μm or less. The manufacture method of the present invention can be applied to the manufacture of semiconductor devices in which a minute pattern is needed, for example, by specifying the particle diameter of the fine particle within this range.

(2) The fine particle may be electrically charged. The fine particle may be electrically charged by electric discharge (glow discharge, arc discharge), or friction during a process flowing through a feeding pipe, by specifying the size of the fine particle within the range of the above (1), for example.

In the case where the fine particles of the raw material species are electrically charged in this manner, use of ions having a polarity differing from that of the fine particles as the active species enables the fine particles to be bond to the ions. As a result, the raw material species are certainly fed to the substrate by the kinetic energy of the active species.

(3) The fine particle of the raw material species may be gasified before being mixed with the active species. A film can be formed in this case.

(4) The active species may be a radical or an ion. In the case of using the ion as the active species, the kinetic energy of the active species can be increased by grounding the substrate.

The active species may be a radical or an ion of the raw material species which becomes part of the raw materials for the ceramics, an ion obtained by activating inert gas, or combination of these. The active species may be a radical or an ion of oxygen or nitrogen when used as the raw material species of the ceramics. The active species may be an ion of inert gas such as argon or xenon when the active species is not used as the raw material species of the ceramics.

As a method for generating radicals or ions, conventional methods such as methods for forming active species using RF (high frequency), microwaves, ECR (electron cyclotron resonance), and the like can be given. The active species may be ozone besides radicals or ions. Ozone may be formed using an ozonizer.

(5) At least the active species may be fed to the substrate in an accelerated state. The kinetic energy of the raw material species can be controlled by thus accelerating the active species, whereby control of the film formation rate, improvement of the coverage properties of the film, and a decrease in the process temperature can be further achieved. As a method for accelerating the active species, a method for applying an electric field or the like can be used.

(6) The ceramic film may be formed on part of the substrate. Specifically, in this manufacture method, a ceramic film is not formed on the entire surface of the substrate, but partly formed in a minute region. The following method is appropriate for this manufacture method. Specifically, the manufacture method may comprise a step of forming a film-forming region having affinity to ceramics to be formed, and a non-film-forming region having no affinity to the ceramics to be formed, thereby self-alignably forming a ceramic film in the film-forming region.

(7) The ceramic film may be formed by an LSMCD process or a misted CVD process. These processes are suitable for achieving the above-described characteristics of the manufacture method of the present invention.

These embodiments according to the present invention can be applied to a manufacture device of the present invention described below.

(B) Manufacture Device

A manufacture device of the present invention comprises:

a disposing section for a substrate on which ceramics is formed;

a heating section for heating the substrate to a given temperature;

a raw material species feeding section for feeding a fine particle of a raw material species which becomes at least part of the raw materials for the ceramics;

an active species feeding section for feeding an active species; and a mixing section for mixing the raw material species fed from the raw material species feeding section and the active species fed from the active species feeding section, wherein a film formation is performed by mixing the raw material species and the active species and feeding the mixed raw material species and active species to the substrate.

The raw material species feeding section may comprise a raw material storing section, and a mist-forming section which makes the raw materials fed from the raw material storing section, into the fine particle. The raw material species feeding section may further comprise a heating section which gasifies the fine particle.

The disposing section for the substrate may form the heating section.

(C) Ceramics obtained by the manufacture method according to the present invention may be used in various types of applications. The following devices may be given as typical application examples.

(1) A semiconductor device comprising a capacitor which comprises a dielectric film formed by the manufacture method of the present invention. As examples of such a semiconductor device, a DRAM using paraelectrics with a high dielectric constant obtained by the manufacture method of the present invention as the dielectric film, a memory device using ferroelectrics (FeRAM), and the like may be given.

(2) A piezoelectric device comprising a dielectric film formed by the manufacture method of the present invention. This piezoelectric device can be applied to actuators, ink-jet heads for ink-jet printers, and the like.

BRIEF DESCRIPTION OF THE DRAWINGS

FIGS. 2A and 2B are views schematically showing a manufacture method and a manufacture device according to a second embodiment of the present invention, wherein FIG. 2A is a plan view showing a substrate, and FIG. 2B is a cross-sectional view along the line A—A shown in FIG. 2A.

DETAILED DESCRIPTION OF THE EMBODIMENT

First Embodiment

Figure 1:
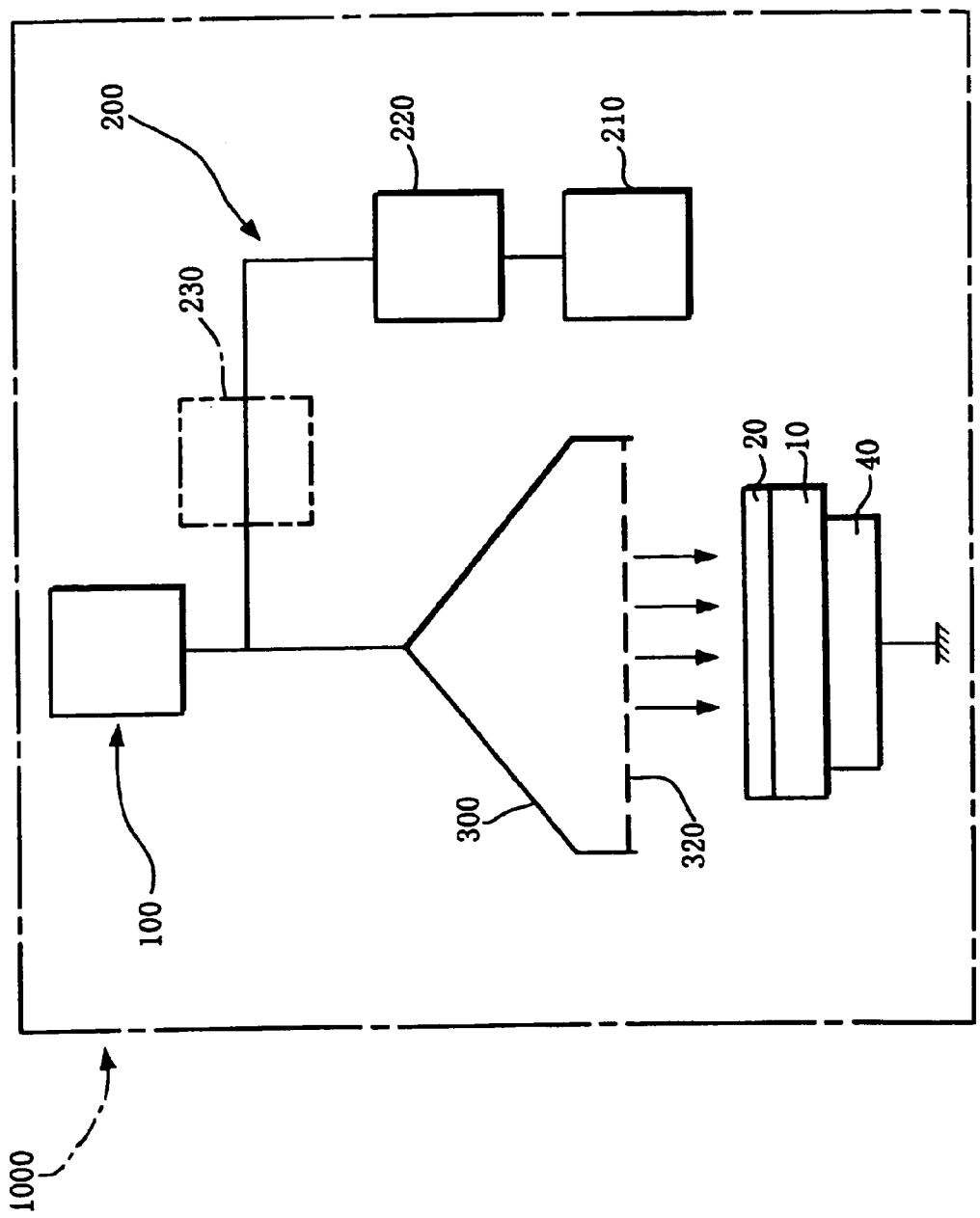
FIG. 1 is a view schematically showing a manufacture method and a manufacture device according to a first embodiment of the present invention.

FIG. 1 is a view schematically showing a method and a device for manufacturing ceramics according to the present embodiment.

In the present embodiment, a device capable of performing LSMCD or misted CVD is used as a manufacture device 1000 for ceramics. The manufacture device 1000 for ceramics includes an active species feeding section 100, a raw material species feeding section 200, a mixing section 300, and a base section (disposing section) 40 for a substrate.

The active species feeding section 100 forms active species such as radicals or ions by any of the above-described methods. The active species are transferred to the mixing section 300.

In the case of using ions as the active species, $Ar^+$, $Kr^+$, $Xe^+$, $O^+$, $O^{2+}$, $N^+$, and the like may be used. In this case, the kinetic energy of these active species can be increased by grounding the base section 40. In the case of forming an oxide such as SBT or PZT, $O^+$ and $O^{2+}$ may be used as the active species. In the case of forming a nitride, $N^+$ may be used as the active species. Combined use of ions of inert gas enables oxygen or nitrogen to be efficiently fed into the crystals, whereby ferroelectrics having superior crystallinity can be obtained.

The raw material species feeding section 200 includes a raw material tank 210 for storing ceramic materials such as organic metals or organic metal complex, and a mist-forming section 220 for forming a mist of the raw materials. The misted raw materials are transferred to the mixing section 300.

In the case of performing deposition by a misted CVD process, the raw material species feeding section 200 may further include a heating section for gasifying the mist disposed between the mist-forming section 220 and the mixing section 300. In this case, a ceramic film having the same film characteristics as in the case of using an LSMCD process can be formed.

There are no specific limitations to the mixing section 300 insofar as the raw material species fed from the raw material species feeding section 200 can be mixed with the active species fed from the active species feeding section 100. A mesh 320 is provided at the end of the mixing section 300.

The base section (disposing section) 40 has a heating section for heating the substrate 10 to a given temperature. The base section 40 is grounded.

In the present embodiment, an electric field may be applied between the mixing section 300 and the base section 40 instead of grounding the base section 40, thereby accelerating the ion species (the active species and the raw material species) transferred to the base section 40 from the mixing section 300. For example, the ion species having positive and negative charges may be accelerated by biasing the base section 40. An electric field may be applied so that the substrate is charged either positively or negatively. In this case, the polarity of the substrate is set to be different from the polarity of the active species. The fine particles of the raw material species can be certainly fed to the substrate 10 by thus accelerating at least the active species using an electric field. Therefore, the process temperature required for controlling the deposition rate and for crystallization can be further decreased.

According to the manufacture device 1000 for ceramics, a ceramic film 20 is formed by the following steps.

In the raw material species feeding section 200, the raw materials fed to the mist-forming section 220 from the raw material tank 210 are misted using supersonic waves, for example, to form a mist (fine particles of raw material species) with a particle diameter having a distribution peak within 0.1 μm or less, and suitably 0.01 μm. The particle diameter of the mist may be changed by the frequency of the supersonic waves, output power, and the like. The mist formed in the mist-forming section 220 is transferred to the mixing section 300. The active species are transferred to the mixing section 300 from the active species feeding section 100. The mist and the active species mixed in the mixing section 300 are fed to the substrate 10 from the mixing section 300, whereby the ceramic film 20 is formed on the substrate 10.

According to the present embodiment, the fine particles of the raw material species are deposited on the substrate 10 while being provided with the kinetic energy by mixing the active species having high kinetic energy and the mist (fine particles of raw material species) in the mixing section 300 before allowing the active species and the mist to come in contact with the substrate 10. Therefore, the deposition rate can be controlled even if the fine particles of the raw material species have a particle diameter of 0.01 μm or less, whereby the ceramic film 20 exhibiting good bottom or side coverage can be formed.

Moreover, migration energy of atoms in the film can be increased by providing energy to the fine particles of the raw material species by the active species. As a result, ceramics having excellent film characteristics such as crystallinity can be formed at a lower process temperature in comparison with the case of feeding no active species.

Since the film obtained in the present embodiment is formed by an LSMCD process or a misted CVD process and has uniformly distributed minute vacancies, the atoms easily migrate. Therefore, the amount of energy required for crystallization can be decreased, thereby further decreasing the process temperature.

Second Embodiment

Figure 2A:
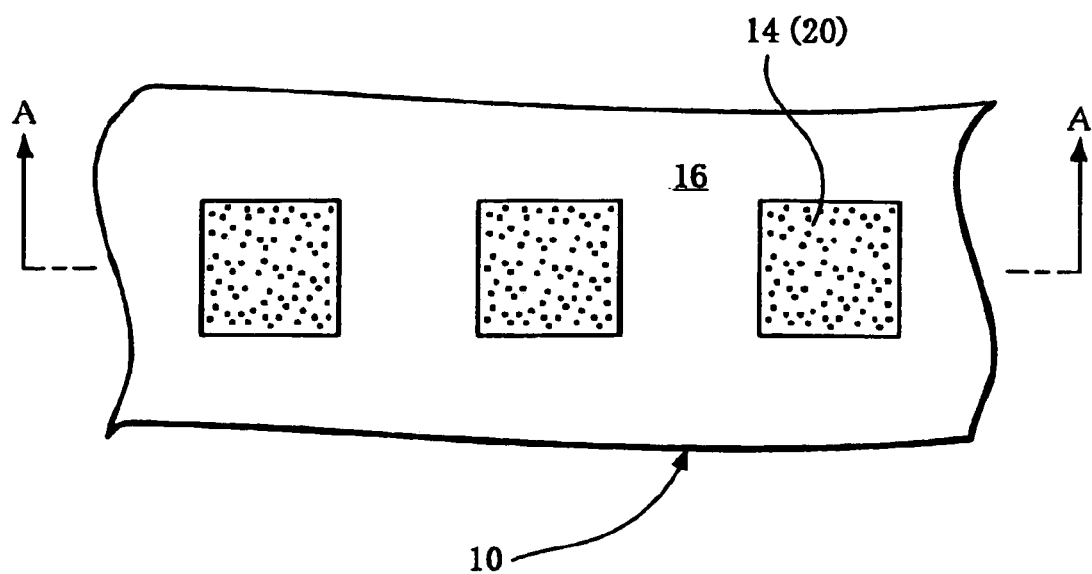
Figure 2B:
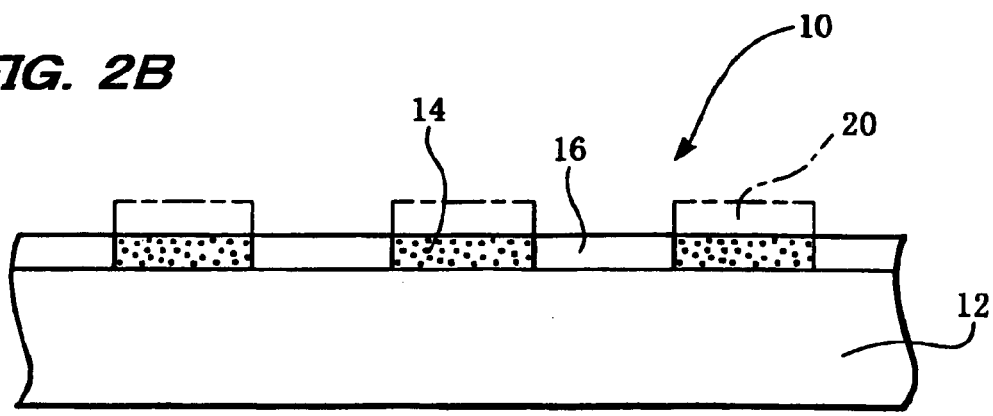

FIGS. 2A and 2B illustrate a modification example of the deposition method of the present invention. FIG. 2A is a plan view showing the substrate 10. FIG. 2B is a cross-sectional view along the line A—A shown in FIG. 2A.

The present embodiment illustrates an example of partly depositing the ceramics on the substrate 10. Since the area for which heating is needed is relatively decreased by partly depositing the ceramics in comparison with the case of forming the ceramics over the entire surface, the amount of energy required for the heating treatment can be decreased. As a result, the temperature of the heating process can be relatively decreased. Therefore, according to the present embodiment, a decrease in the process temperature can be further achieved in addition to a decrease due to application of the active species.

In the present embodiment, the substrate 10 includes a body portion 12, and film-forming sections 14 and a non-film-forming section 16 which are formed on the body portion 12.

The film-forming sections 14 are formed using a material having high chemical or physical affinity to the ceramics formed on the substrate 10, such as a material having good wettability with the raw material species of the ceramics. On the contrary, the non-film-forming section 16 is formed using a material having poor chemical or physical affinity to the ceramics to be deposited, such as a material having low wettability with the raw material species of the ceramics.

The ceramic film 20 with a specific pattern is formed by thus forming the surface of the substrate 10, specifically, by disposing the film-forming sections 14 in the regions in which it is desired to form a ceramic film 20.

In the case of forming a ferroelectric film as the ceramic film, for example, iridium oxide may be used as the material for the film-forming sections 14, and a fluorine compound may be used as the material for the non-film-forming section 16.

The method for manufacturing ceramics according to the present embodiment can be applied to various types of ceramics such as ferroelectrics. The method can be suitably applied to layered perovskite, in particular. In layered perovskite, oxygen, in particular, radicals (atomic oxygen) tend to be diffused in a direction intersecting the c-axis at right angles. Therefore, radicals easily migrate from the side of the ceramic film 20 in the heating process for crystallization. As a result, oxygen loss in perovskite is decreased and the polarization characteristics are improved, thereby preventing deterioration of fatigue characteristics, imprint characteristics, and the like.

Third Embodiment

Figure 3:
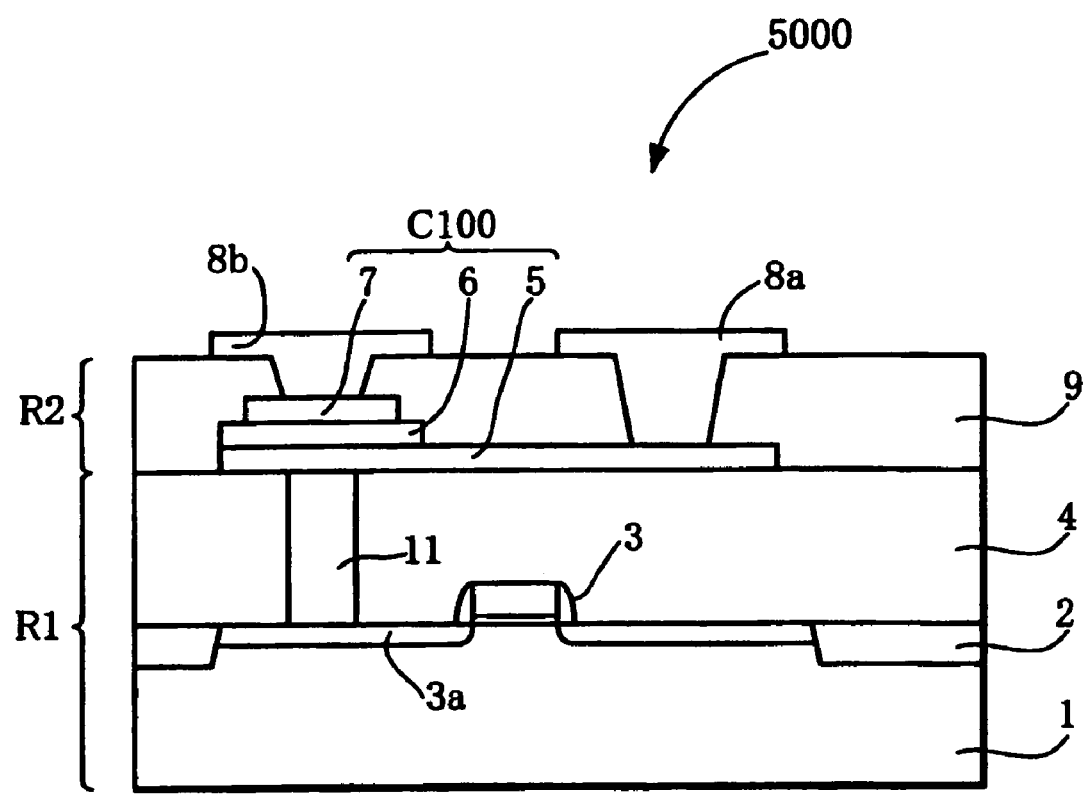
FIG. 3 is a cross-sectional view schematically showing a semiconductor device (ferroelectric memory device) according to a third embodiment of the present invention.

FIG. 3 illustrates an example of a semiconductor device (ferroelectric memory device 5000) using the ferroelectrics obtained by the manufacture method according to the present invention.

The ferroelectric memory device 5000 includes a CMOS region R1, and a capacitor region R2 formed on the CMOS region R1. The CMOS region R1 has a conventional structure. Specifically, the CMOS region R1 includes a semiconductor substrate 1, an element isolation region 2 and a MOS transistor 3 formed on the semiconductor substrate 1, and an interlayer dielectric 4. The capacitor region R2 includes a capacitor C100 consisting of a lower electrode 5, a ferroelectric film 6, and an upper electrode 7, an interconnect layer 8a connected to the lower electrode 5, an interconnect layer 8b connected to the upper electrode 7, and an insulating layer 9. An impurity diffusion layer 3a of the MOS transistor 3 and the lower electrode 5 which makes up the capacitor C100 are connected through a contact layer 11 formed of polysilicon or a tungsten plug.

In the ferroelectric memory device 5000 according to the present embodiment, the ferroelectric (PZT, SBT) film 6 which makes up the capacitor C100 can be formed at a temperature lower than that for conventional ferroelectrics. For example, in the case of PZT, the ferroelectric film 6 can be formed at 500° C. or less. In the case of SBT, the ferroelectric film 6 can be formed at 600° C. or less. According to the present invention, the crystallization temperature can be decreased to 450° C. or less by specifying the residual polarization to about 10 $\mu C/cm^2$ in the case of PZT, or about 5 $\mu C/cm^2$ in the case of SBT while allowing the fatigue characteristics, imprint characteristics, and retention characteristics to be equal to conventional ferroelectrics.

Therefore, since the CMOS region R1 can be prevented from being heat damaged at the time of forming the ferroelectric film 6 in the present embodiment, the capacitor C100 can be applied to highly integrated ferroelectric memory devices. Moreover, since the ferroelectric (PZT, SBT) film 6 can be formed at a temperature lower than that for conventional ferroelectrics, deterioration of interconnect layers or electrode sections can be prevented even if expensive materials such as iridium and platinum are not used as the materials for interconnect layers (not shown) in the CMOS region R1 and the electrode sections 5 and 7 which make up the capacitor C100. Therefore, cheap aluminum alloys can be used as the materials for the interconnect layer and the electrode sections, thereby reducing cost.

In semiconductor devices such as a CMOS, a semiconductor process and a capacitor process are generally isolated in order to prevent contamination due to ferroelectrics (PZT, SBT). However, according to the manufacture method of the present invention, since the process temperature for the ferroelectrics can be decreased, capacitors can be continuously formed after performing a multilayer interconnection step, which is the final step in a conventional semiconductor process. Therefore, the number of processes which must be isolated can be decreased, whereby the process can be simplified. Moreover, since the manufacture method of the present invention does not need the semiconductor process and the capacitor process to be isolated, the method is advantageous for manufacturing a semiconductor device including logic circuits, analog circuits, and the like in combination.

Dielectrics formed using the manufacture method of the present invention can be applied not only to the above ferroelectric memory device, but also to various types of semiconductor devices. For example, in the case of a DRAM, the capacity of a capacitor can be increased by using paraelectrics with a high dielectric constant such as BST.

Ferroelectrics formed using the manufacture method of the present invention may be applied to other applications such as piezoelectrics of piezoelectric devices used for actuators, or ink-jet heads for ink-jet printers.

Nitrides (silicon nitride, titanium nitride) formed using the manufacture method of the present invention may be applied to passivation films and local interconnect films of semiconductor devices, and the like.

What is claimed is:

1. A method for manufacturing ceramics on a substrate, comprising:

mixing a fine particle of a raw material species which becomes at least part of raw materials for ceramics with an active species having high kinetic energy in a mixing chamber;

after mixing the fine particle and active species in the mixing chamber, feeding the mixed fine particle and active species from the mixing chamber to the substrate so that the fine particles of the raw material species are deposited on the substrate while being provided with kinetic energy from the active species; and increasing the migration energy of atoms in the ceramic film for crystallization of the ceramic film by providing energy to the fine particles of the raw material species by the active species, wherein the ceramic film is formed by an LSMCD process or a misted CVD process.

2. The method for manufacturing ceramics according to claim 1, further comprising:

forming a film-forming region having affinity to ceramics to be formed, and a non-film-forming region having no affinity to the ceramics to be formed, thereby self-alignably forming a ceramic film on a film-forming region, the film-forming region being the partial portion of the substrate.

3. The method for manufacturing ceramics according to claim 1, further comprising:

biasing the substrate holder to accelerate the complex of the active species and the fine particle of the raw material species during deposition.

4. The method for manufacturing ceramics according to claim 1, a diameter of the fine particle being 0.1 μm or less.

5. The method for manufacturing ceramics according to claim 1, a diameter of the fine particle being 0.01 μm or less.

6. The method for manufacturing ceramics according to claim 1, the fine particle being electrically charged.

7. The method for manufacturing ceramics according to claim 1, the fine particle of the raw material species being gasified before being mixed with the active species.

8. The method for manufacturing ceramics according to claim 1, the active species being a radical or an ion.

9. The method for manufacturing ceramics according to claim 8, the active species being a radical or an ion of the raw material species which becomes part of the raw materials for ceramics.

10. The method for manufacturing ceramics according to claim 8, the active species being a radical or an ion of oxygen or nitrogen.

11. The method for manufacturing ceramics according to claim 8, the active species being an ion obtained by activating inert gas.

12. The method for manufacturing ceramics according to claim 11, the inert gas being an ion of argon or xenon.

13. The method for manufacturing ceramics according to claim 1, at least the active species being fed to the substrate in an accelerated state.

14. The method for manufacturing ceramics according to claim 1, the ceramic film being a dielectric.

15. The method for manufacturing ceramics according to claim 14, the dielectric being formed at a temperature of 600° C. or less.

16. The method for manufacturing ceramics according to claim 14, the dielectric being formed at a temperature of 450° C. or less.

* * * * *